United States Patent

(12) United States Patent
Ido et al.

(10) Patent No.: US 7,511,647 B2
(45) Date of Patent: Mar. 31, 2009

(54) DYNAMIC ELEMENT MATCHING METHOD AND DEVICE

(75) Inventors: Toru Ido, Minoo (JP); Soichiro Ishizuka, Ebina (JP)

(73) Assignee: Texas Instruments Incorporated, Dallas, TX (US)

( * ) Notice: Subject to any disclaimer, the term of this patent is extended or adjusted under 35 U.S.C. 154(b) by 19 days.

(21) Appl. No.: 11/697,235

(22) Filed: Apr. 5, 2007

(65) Prior Publication Data

US 2007/0252743 A1 Nov. 1, 2007

(51) Int. Cl.
*H03M 3/00* (2006.01)

(52) U.S. Cl. .................................... 341/143; 341/153

(58) Field of Classification Search ................ 341/143, 341/144, 153
See application file for complete search history.

(56) References Cited

U.S. PATENT DOCUMENTS 4,791,406 A * 12/1988 Mehrgardt et al. .......... 341/144
6,384,761 B1 * 5/2002 Melanson .................. 341/143
6,897,797 B2 * 5/2005 Zhao et al. ................. 341/144
2003/0085827 A1 * 5/2003 Koifman et al. ............ 341/144

OTHER PUBLICATIONS

Ido, T. et al., A Digital Input Controller for Audio Class-D Amplifiers with 100W 0.004% THD+N and 113dB DR, IEEE International Solid-State Circuits Conference, 2006. ISSCC 2006. Digest of Technical Papers. Publication Date: Feb. 6-9, 2006, On pp. 1366-1375.*

* cited by examiner

*Primary Examiner*—Howard Williams
(74) *Attorney, Agent, or Firm*—William B. Kempler; Frederick J. Telecky, Jr.; Wade J. Brady, III

(57) ABSTRACT

The invention provides an improved dynamic element matching (DEM) device. The DEM device performs dynamic element matching processing at a second timing rate different from the first timing rate for the digital input. As an embodiment, the DEM device is composed of encoder 10 and feedback circuit 12. Said encoder 10 has two inputs and one output. Of the two inputs, one receives the digital input as the object for the DEM processing, and the other input receives the output of feedback circuit 12. Then, the digital output of the encoded result is generated. Said feedback circuit 12 has sampling rate converter 120 and loop filter 122 in order to perform DEM processing at a timing rate different from the timing rate for the digital input as the DEM processing object.

13 Claims, 13 Drawing Sheets

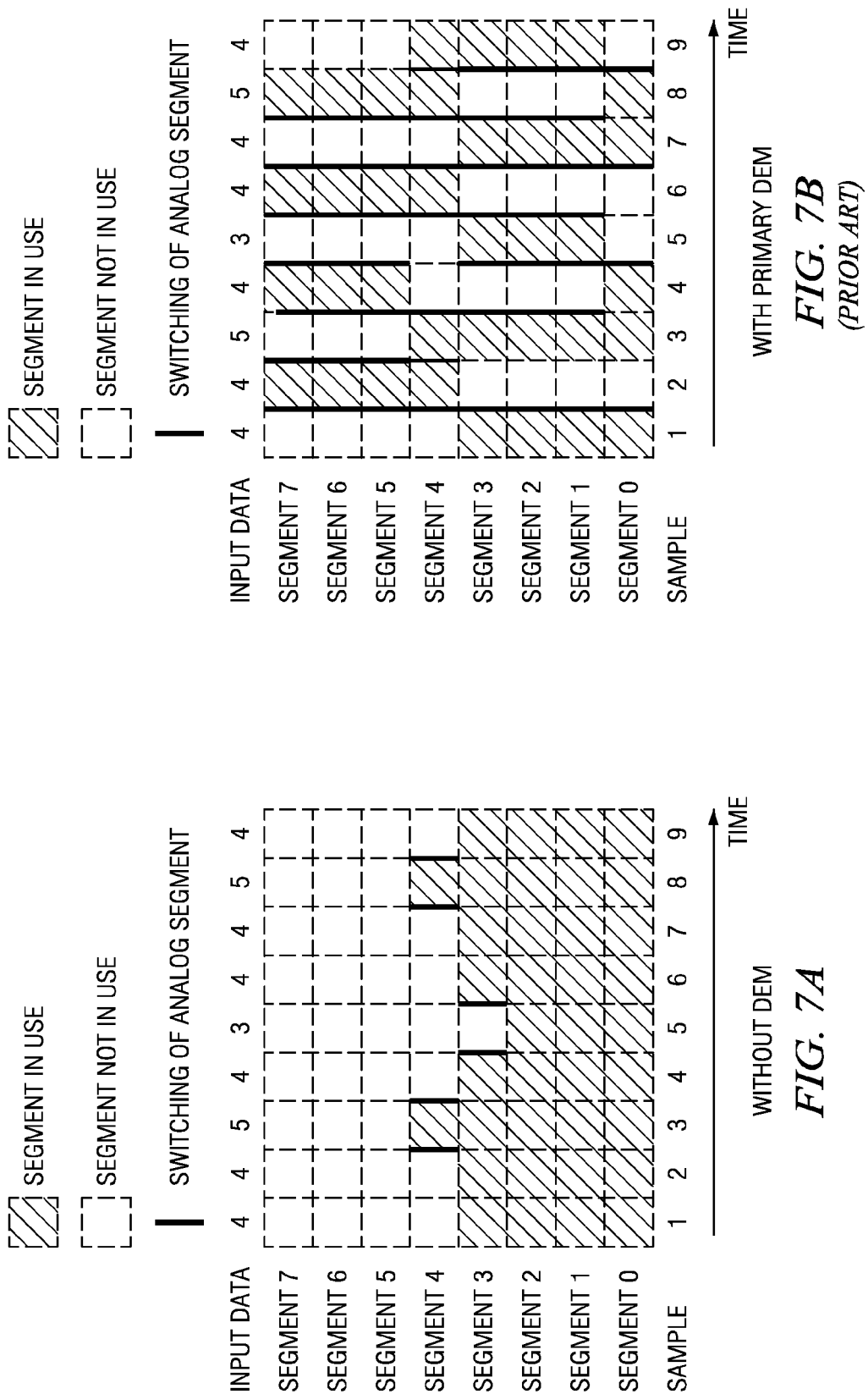

ENCODE PATTERN SELECTION TABLE

| | CONDITION | SELECTION PATTERN |
|---|---|---|
| 1 | d[x-1]=d[x]-1 and d[x+1]=d[x]-1 | PROJECTS UPWARD |
| 2 | d[x-1]=d[x]+1 and d[x+1]=d[x]+1 | PROJECTS DOWNWARD |
| 3 | IT IS NEITHER 1 NOR 2, d[X] $\geq$ 0 | PROJECTS UPWARD |
| 4 | IT IS NEITHER 1 NOR 2, d[X] <0 | PROJECTS DOWNWARD |

DYNAMIC ELEMENT MATCHING METHOD AND DEVICE

This application claims priority from Japanese Patent Application Nos. 2006-104857 and 2006-104858, both filed Apr. 6, 2006, the entireties of which are incorporated herein by reference. Pending U.S. Patent Application Ser. No. 11/697,228, filed under Docket No. TI-60997 on the same date as this application and which claims priority from the same Japanese applications is also incorporated herein by reference.

BACKGROUND OF THE INVENTION

The present invention pertains to a dynamic element matching method and device for use in a digital/analog converter (DAC) and other electronic devices.

Conventional DACs include the ΔΣ (delta-sigma) modulator type, which employs over-sampling. The characteristics of the ΔΣ modulator used in said DAC primarily depend on the operating frequency and the oversampling ratio. That is, as the oversampling ratio is increased, the quantization noise (the source of the out-of-band noise) decreases, and the noise-shaped bandwidth increases. Consequently, one may simply increase the over-sampling ratio of the ΔΣ modulator. On the other hand, for a high over-sampling ratio, the analog portion (especially the plural analog segments that function as weight generators of the DAC) requires a high operating frequency. However, if the operating frequency is too high, distortion will occur, and the distortion performance (THD performance) will deteriorate. As a result, there is a trade-off between the over-sampling ratio and the analog distortion.

In the ΔΣ modulator DAC of the prior art, a dynamic element matching (DEM) circuit is used (see Non-Patent References 1-3). In this DAC, the distortion of the an analog portion takes place due to high speed switching of the analog segment (it acts as a weight generator, and is also called the conversion element), and the switching of said analog segment mainly depends on the DEM circuit contained in the DAC. For the DEM circuit, in order to reduce the influence of mismatch between analog segments, that is, the influence of mismatch between weights generated for the various analog segments, the number of switching times for the analog segments is greatly increased. As a result, distortion of the analog portion rises.

For references, see, Tao Shui, Richard Schreier and Forrest Hudson, "Mismatch Shaping for a Current-Mode Multibit Delta-Sigma DAC," IEEE Journal of Solid-State Circuits, Vol. 34, No. 3, Mar. 1999, pp. 331-338; R. Schreier and B. Zhang, "Noise-shaped Multibit D/A Convertor Employing Unit Elements," Electronics Letters, 28th Sep. 1995, Vol. 31, No. 20, pp. 1712-1713; and Tao Shui, Richard Schreier and Forrest Hudson, "Modified "Mismatch-Shaping for Continuous Time Delta-Sigma Modulators," IEEE 1998, Custom Integrated Circuits Conference, pp. 225-228.

Consequently, the purpose of the present invention is to provide an improved dynamic element matching (DEM) method and device.

Another purpose of the present invention is to provide a DAC or other electronic device adopting said DEM method or device.

SUMMARY OF THE INVENTION

According to one embodiment of the present invention, for the dynamic element matching method and device, with respect to the digital input, dynamic element matching processing is performed at a second time rate different from the first time rate of the digital input.

In another embodiment of the present invention, said second time rate can be lower than said first time rate. Also, in yet another embodiment of the present invention, said second time rate can be higher than said first time rate.

BRIEF DESCRIPTION OF THE DRAWINGS

Example embodiments of the invention are described with reference to accompanying drawings, wherein:

FIGS. 7A and 7B show charts illustrating the selection example of use/no-use of analog segment performed by DEM operation in the DAC shown in FIGS. 3 and 4. FIG. 7A shows the case when there is no DEM and it is for comparison. FIG. 7B shows the case when the conventional primary DEM processing is performed.

FIG. 8A shows the case when the input data are near the full scale of the plus sign, and FIG. 8B shows the example of selection of use/no-use of the analog segment near the full scale of the minus sign.

DETAILED DESCRIPTION OF EMBODIMENTS

According to said first embodiment of the present invention, the DEM processing rate can be set differently from the processing rate for input in receiving the object of the DEM processing. Consequently, in said first embodiment of the present invention, by using a DEM processing rate lower than that for the input of the DEM processing object, it is possible to reduce the number of analog/digital switching times performed as a function of the weight generator. As the number of switching times is reduced, the distortion is reduced and the distortion performance (THD+N) is improved.

In the following, an explanation will be given in more detail regarding the embodiment of the present invention with reference to the figures.

Figure 1:
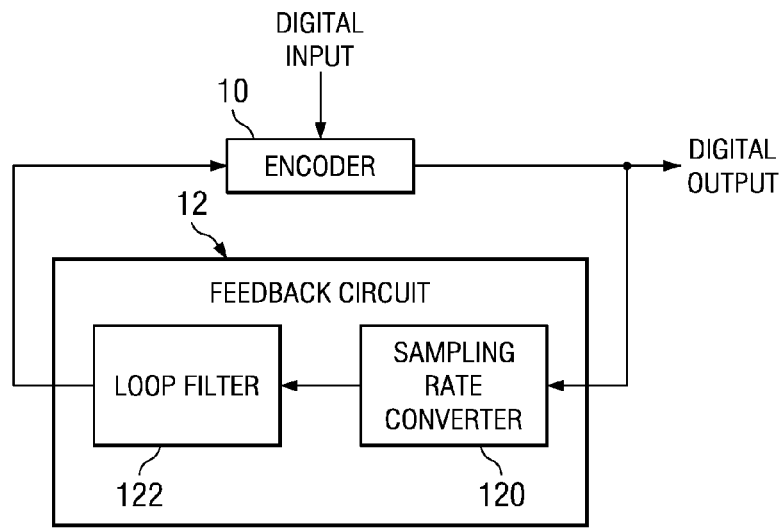
FIG. 1 is a block diagram illustrating the DEM (dynamic element matching) circuit in a first embodiment of the present invention.

First of all, FIG. 1 shows DEM (dynamic element matching) circuit 1 as Embodiment 1 of the present invention. As shown in the figure, this DEM circuit 1 is composed of encoder 10 and feedback circuit 12. Said encoder 10 has two inputs and one output. Of said two inputs, one input receives the digital input as the object of the DEM processing, and the other input receives the output of feedback circuit 12. On the other hand, the output generates the digital output as a result of encoding. In order to perform DEM processing at a timing rate different from that of the digital input of the DEM processing object, said feedback circuit 12 includes sampling rate converter 120 and loop filter 122. Said sampling rate converter 120 converts the sampling rate of the digital output received from encoder 10 and outputs the result as a digital signal. Thus, the timing rate of the DEM processing is different from the timing rate of the digital input. More specifically, the timing rate here refers to the sampling frequency of the signal. Then, after said sampling rate is converted and output to loop filter 122 as a digital signal, the signal is filtered and a filter output appropriate for processing by the encoder is generated.

More specifically, in order to perform dynamic reduction of the mismatch between the prepared plural elements (such as the analog segments of the DAC), encoder 10 can be formed from any circuit that can generate signals for using plural elements as uniformly as possible, such as a vector quantizer, lookup table, processor, digital signal processor (DSP), etc. Sampling rate converter 120, on the other hand, may be of the well known circuit design, and, for example, a downconverter for reducing the sampling rate may be used.

Figure 2:
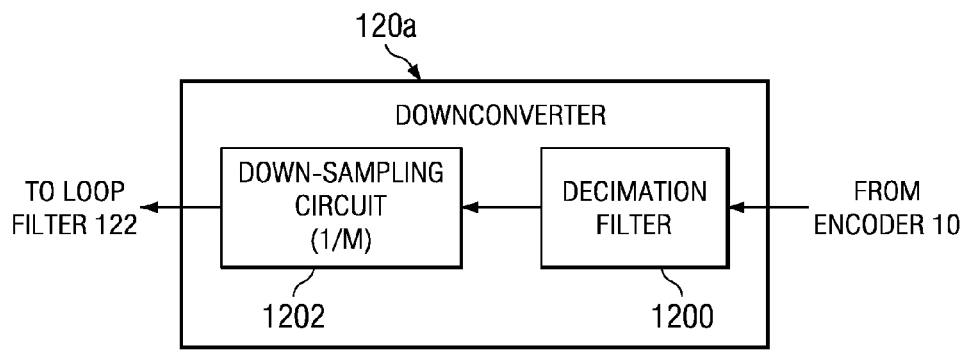
FIG. 2 is a block diagram illustrating the downconverter in said first embodiment.

FIG. 2 is a diagram illustrating downconverter (120a) as an embodiment. Here, as shown in the figure, downconverter (120a) includes decimation filter 1200 and down-sampling circuit 1202 which receives its output and performs (1/M) down-sampling.

Also, loop filter 122 may an integrator. As a result, it generates a value corresponding to the number of cycles not recently selected for each element, and this value is used by encoder 10 to select the next element to be used. The value corresponding to the number of cycles not recently selected may include a value proportional or inversely proportional to the number of cycles or frequency not recently selected. It depends on the selection algorithm of the element to be used next in encoder 10.

For DEM circuit 1 with said constitution, it is possible to have the timing rate for DEM processing different from the timing rate for the digital signal as the object of DEM processing. As a result, for example, when the timing rate of the DEM processing is lower than the timing rate of the digital signal as the DEM processing object, it is possible to reduce the number of switching times for the elements, so that it is possible to reduce the distortion and to improve the THD performance. On the other hand, when the timing rate of the DEM processing is higher than the timing rate of the digital signal as the DEM processing object, because the dynamic element matching rate is high, the DEM performance is improved. As a result, according to said first embodiment of the present invention, it is possible to perform DEM processing at a timing rate different from the timing rate of the digital signal as the DEM processing object.

In the following, an explanation will be given regarding digital/analog converter (DAC) A for audio use in an embodiment using DEM circuit 1 shown in FIG. 1. In this figure, the elements corresponding to those in FIG. 1 are denoted by the same part numbers but with an "A" appended to each. More specifically, DAC A has $\Delta\Sigma$ modulator 3, DEM circuit (1A), and current segment type DAC 5 having N current segments operating as weight generators. The weight generators may be made up of segment type devices, inverters, switched capacitors, current sources, etc. The weights generated by said weight generators may be in the form of current, as well as voltage or any other form. The audio digital input to be converted into analog form is sent to modulator 3, and this modulator $\Delta\Sigma$ modulates the received digital input for noise shaping, and the resulting modulated output is generated as a digital output. DEM circuit (1A) having the digital output fed from said modulator is the type that has downconverter (120a) shown in FIG. 2 as sampling rate converter 120 corresponding to DEM circuit 1 shown in FIG. 1. Consequently, this DEM circuit executes DEM processing at a timing rate lower than the timing rate of the modulation output. This DEM circuit (1A) performs DEM processing on the modulation output, and the resulting DEM output is generated. Said current segment type DAC 5 that has the DEM output sent to it, is a DAC well known in the prior art, and it has N current segments that can generate currents having the same magnitude as the analog segments that function as weight generators. Said N current segments are selected for use corresponding to the DEM output, and outputs an audio analog signal.

Figure 3:
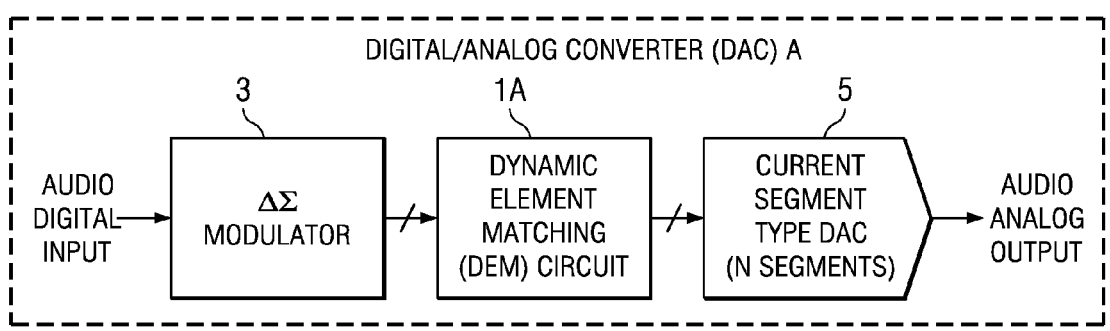
FIG. 3 is a block diagram illustrating the digital/analog converter (DAC) in said first embodiment using the DEM circuit shown in FIG. 1.
Figure 4:
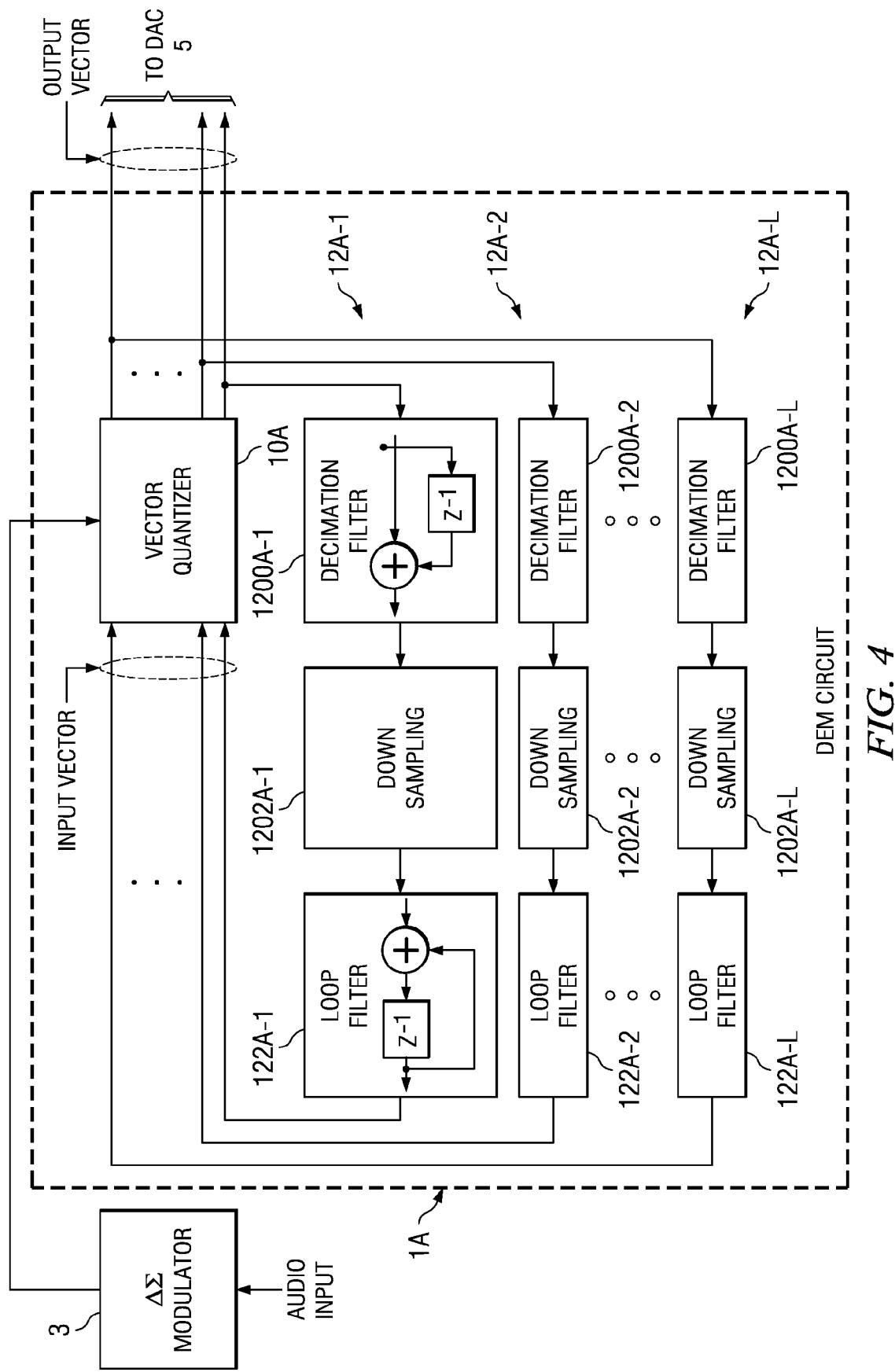
FIG. 4 is a more detailed block diagram illustrating the DEM circuit shown in FIG. 3.
Figure 5:
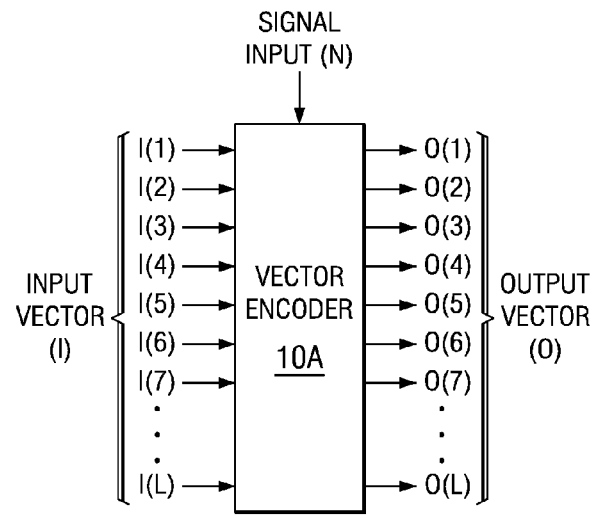
FIG. 5 is a diagram illustrating in detail the input and output of the vector quantizer in FIG. 4.

FIG. 4 shows DEM circuit (1A) of FIG. 3 in more detail. Also, in this figure, the elements corresponding to the elements in FIGS. 1 and 2 are denoted by the same part numbers but with an "A"appended to each. As shown in the figure, DEM circuit (1A) has vector encoder (10A), and plural feedback paths (12A-1)-(12A-L) as the feedback circuit. More specifically, as shown in FIG. 5, vector encoder (10A) has an input for receiving the modulation output from $\Delta\Sigma$ modulator 3 as signal input (N), L vector input terminals receiving input vector (I) (having input vector elements I[1]-I[L]), and L vector output terminals that generate output vectors (O) (having output vector elements O[1]-O[L]). It generates the output segments corresponding to the modulation output and input vector. The output vector is fed to N current segments of current segment type DAC 5. Also, the N current segments and the L vector elements of the input and output vectors are usually equal.

Also, L elements O[1]-O[L] of the output vector of vector encoder 10A are fed to L feedback paths 12A-1-12A-L, forming L elements I[1]-I[L] of the input vector from the outputs of said paths. Here, in the present embodiment, the various elements of the output vector each take on one of two values: "1" indicating use of the related analog segment and "−1" indicating that the related segment is not used. It may also take on other values than said two values, such as "1" and "0." Since the feedback paths receiving said output vector elements are the same, only one, that is, feedback path 12A-1, will be explained in detail. As shown in the figure, feedback path 12A-1 has decimation filter 1200A-1 and down-sampling circuit 1202A-1 that form downconverter 120a, as well as loop filter 122A-1. Said decimation filter 1200A-1 receives output vector element O[1] and filters it to generate an output. As shown in the figure, this filter can be a first-order filter with a delay unit and an adder. However, it can also be a second-order or higher-order filter. Upon receiving said filter output, said down-sampling circuit 1202A-1 performs down-sampling to lower the sampling rate to 1/M. Here, 1/M may be ½, ¼, ⅛ or another integral fraction. Then, upon receiving the output from said down-sampling circuit, loop filter 122A-1 can be composed of a first-order low-pass filter, that is, an integrator, with an adder and a delay unit. Also, it may be a second-order or higher-order integrator. Also, loop filter 122A-1 contains an inverter for generating a filter output that is the inverse of the integrator output. When the most closely related current segments are selected in the largest number, the output generated from the loop filter in said constitution has the smallest value, that is, the maximum negative value; when the most closely related current segments are selected in the smallest number, it has the largest value, that is, the largest positive value; and, in the case of the intermediate selection frequency, it has an intermediate value between the largest positive value and the largest negative value. In this way, feedback path 12A-1 generates from output vector element O[1] the value corresponding to the most recent selected number of cycles of the current segments related to the element. For the other feedback paths 12A-2-12-A-L, the same operation is performed, and the value corresponding to the recently selected number of cycles of the related current segments is taken as input vector elements I[2]-I[L].

Figure 6:
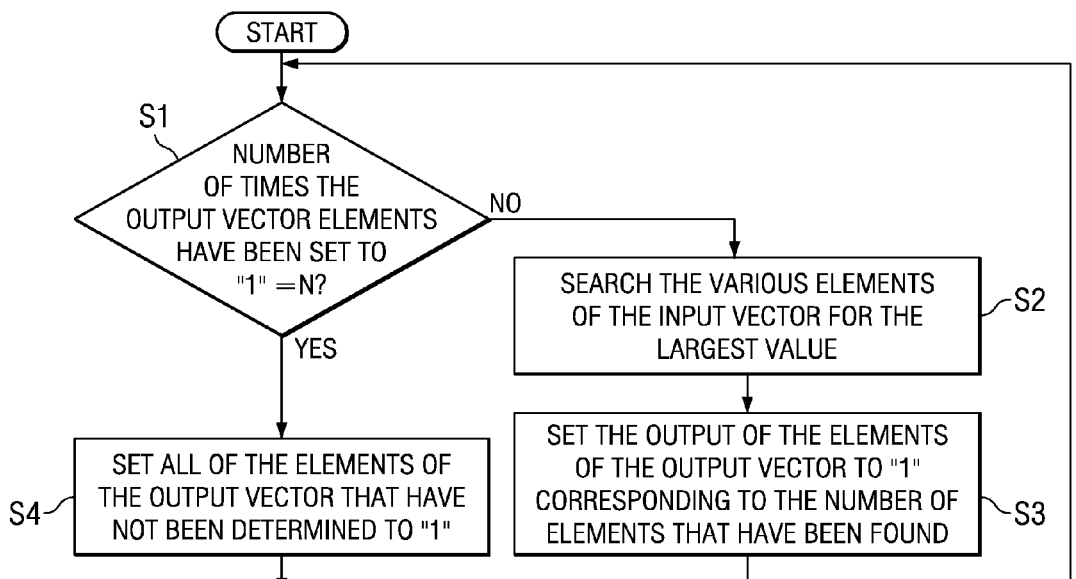
FIG. 6 is a flow chart illustrating the vector quantization algorithm executed by the vector quantizer shown in FIG. 5.

FIG. 6 is a diagram illustrating the vector quantization algorithm of vector encoder 10A receiving said generated input vector elements I[1]-I[L] and signal input (N), and the output vector is determined according to this algorithm. First of all, in step S1, if the number of cycles when "1" is set in the output vector elements that have been output is equal to input signal N, process control goes to step S4. Otherwise, process control goes to step S2. When it is not equal to value N, in step S2, the largest value among the various element values of the input vector is searched. Here, the corresponding output element O[x] is searched from those that have not been determined, and the found element number is taken as X. That is, I[X]≧I[j]. Here, one has 0≦j≦L, and, when j≠X,X is not used. Then, process control goes to step S3. Here, the output of the elements of the output vector corresponding to the element number found in step S2 is set to "1." That is, one has O[X]=1. Then, process control returns to step S1. On the other hand, when it is YES in step S1, that is, when "1" is set only for the number equal to value N, process control goes to step S4. Here, all of the elements of the output vector that have not been determined are taken as "−1." As a result, the present algorithm comes to an end. As a result of said processing, in the output vector, for the element with smaller number of cycles of setting to "1," a larger value is realized for the corresponding input vector element. As a result, it becomes easier to select the elements that output "1" in the next cycle. Due to this operation, the number of cycles of use of the current segments in DAC 5 is averaged, so that DEM processing is realized.

In the following, an explanation will be given regarding the DEM operation in DAC A shown in FIGS. 3 and 4 with reference to FIGS. 7A-9B. FIGS. 7A and 7B illustrate an example of selection of use/non-use of analog segments in the case when the input data are near bipolar zero in DAC equipped with 8 analog segments (in the example shown in the figure, the input data vary as 4, 4, 5, 5, 3, 4, 4, 5, 4). FIG. 7A shows the case when no DEM processing is performed, and FIG. 7B shows the case when primary DEM processing is performed. Also, in FIGS. 7A-9B, in each of samples 1-9, the segments in the number equal to the value of the input data of the sample are separated.

As can be seen from FIG. 7A, when there is no DEM processing, switching of the analog segment only takes place due to a change in the input data. As a result, the number of switching times is very small. On the other hand, FIG. 7B shows the case when primary DEM processing is performed when the same input data that appear in FIG. 7A are received. In this case, in order to avoid using the segments that were used in the last cycle as much as possible, the number of the segments with switching from "1" (that is, use) to "−1" (that is, non-use) and from "−1" to "1" greatly increases. As a result, the number of switching times for the analog segments increases. For example, between sample 1 and sample 2, when no DEM is performed (FIG. 7A), there is no change in the input data, so that no switching takes place. On the other hand, when there is DEM (FIG. 7B), four cycles of switching from "1" to "−1" and four cycles of switching from "−1" to "1" take place.

Figures 8A, 8B:
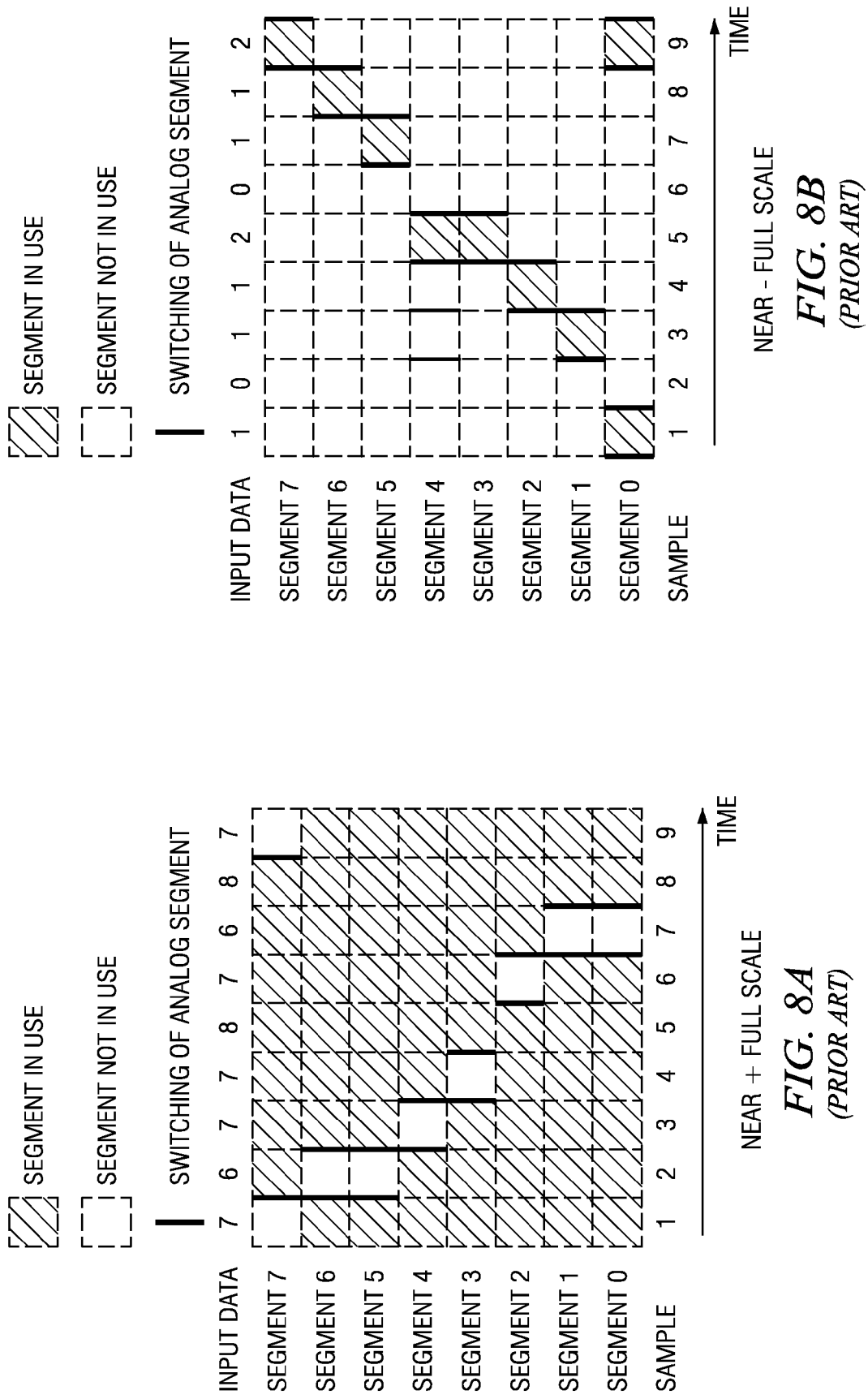
FIGS. 8A and 8B show charts similar to those of FIGS. 7A and 7B.

On the other hand, FIGS. 8A and 8B show an example of the selection of use/non-use of the analog segments when the input data are near positive full scale (FIG. 8A) and negative full scale (FIG. 8B). In the example shown in FIGS. 8A and 8B, DEM processing is performed. As can be seen from FIGS. 8A and 8B, near full scale, the number of switching times for the analog segments is smaller than that near the bipolar zero. In this way, the number of switching times significantly depends on the level of the input data, and it becomes the maximum at the bipolar zero.

Figure 9A:
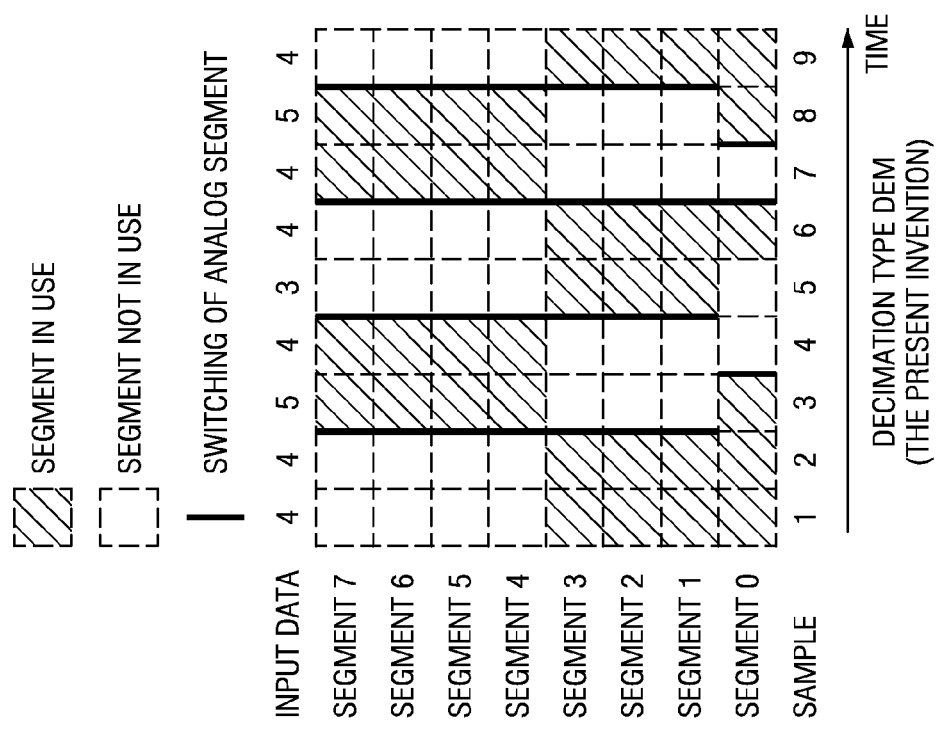
FIGS. 9A and 9B show charts similar to those of FIGS. 7A and 7B. They compare the case of DEM processing (shown in FIG 9B) according to the present invention and the case of the conventional primary DEM processing (shown in FIG. 9A).
Figure 9B:
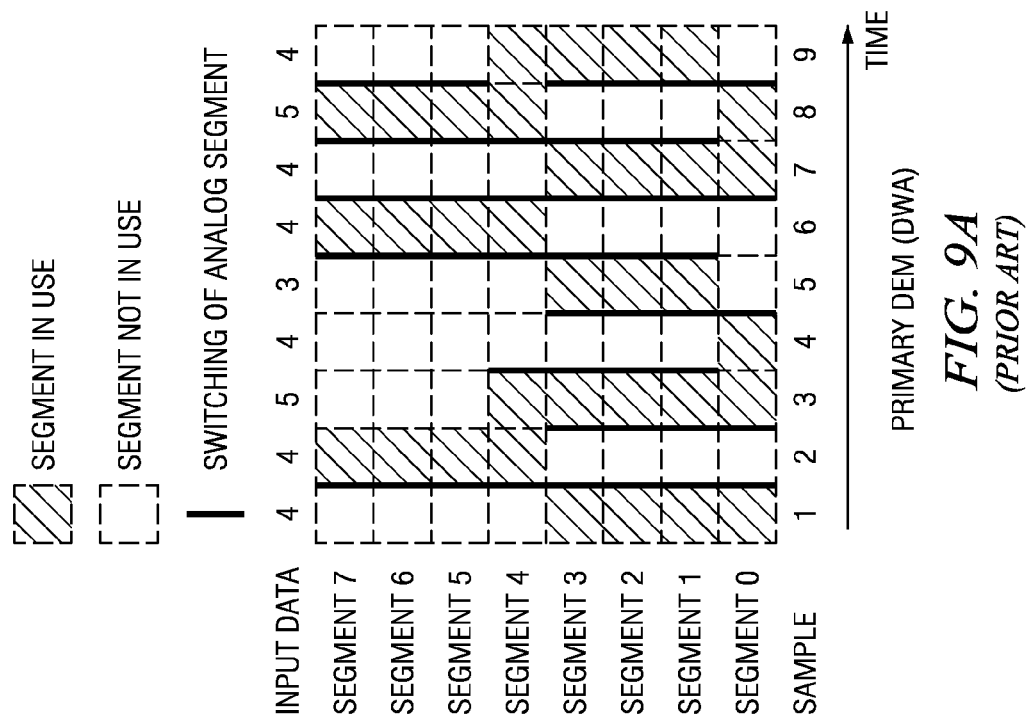

FIGS. 9A and 9B illustrate a comparison between the DEM processing of the present invention and the DEM processing of the prior art. FIG. 9A shows an example of selection for use/non-use of analog segments shown in FIG. 7B. FIG. 9B shows an example of selection of use/non-use of analog segments when the decimation type DEM of the present invention is performed for the same input data as the data in the example shown in FIG. 7B. In the decimation type DEM processing shown in FIG. 9B, M=2 (that is, the down-sampling ratio by means of circuit 1202A shown in FIG. 4 is 1/2), and a first-order loop filter is used as loop filter 122A. As can be seen from FIG. 9A, in the DEM processing of the prior art, because the ΣΔ modulator and DEM processing use the same operating frequency, since the over-sampling ratio in the ΣΔ modulator is increased, the DEM processing rate becomes higher. As a result, the number of switching times for the analog segments becomes higher. On the other hand, in the decimation type DEM processing of the present invention shown in FIG. 9B, as 1/2 down-sampling is performed, in the transition from an odd-numbered sample to an even-numbered sample, there is no change in the loop filter output, and, only during the transition from the even-numbered sample to the odd-numbered sample is the loop filter output changed. As a result, compared with the prior art shown in FIG. 9A, in the case shown in FIG. 9B, the number of switching times for the segments can be nearly halved. For example, in the transition from sample 1 to sample 2, since there is no change in the loop filter output, the input data have the same value of "4," so that the same analog segments are selected. As a result, no switching of the analog segments takes place at all. Here, when the transition is made from sample 3 to sample 4 with a change in the input data, and when the transition is made from sample 5 to sample 6, or from sample 7 to sample 8, switching takes place only for the analog segments in the same number as that of the change in the input data ("1" in this case). As a result, there is little deterioration in the distortion performance. On the other hand, in the transition from an even-numbered sample to an odd-numbered sample with a change in the loop filter output, such as the transition from sample 2 to sample 3, or from sample 4 to sample 5, etc., the operation of the decimation type DEM is the same as that in the DEM processing of the prior art. As a result, switching takes place only in the same number as that shown in FIG. 9A.

As explained above, for the decimation type DEM of the present invention, it is possible to significantly reduce the number of switching times for the analog segments while maintaining the noise-shaping operation for the mismatch between segments by means of the DEM. Also, by using the DEM of the present invention, it is possible to use a different operating frequency of the ΔΣ modulator than the operating frequency of the DEM processing. As a result, it is possible to further increase the over-sampling ratio of the ΔΣ modulator without deterioration in the performance due to DEM. Also, in said example, the down-sampling ratio in down-sampling circuit 1202A is 2 (that is, M=2). However, one may also make use of other down-sampling ratios, such as 4, 8, etc. When said ratios are used, it is also possible to reduce the number of switching times as described above.

Figure 10:
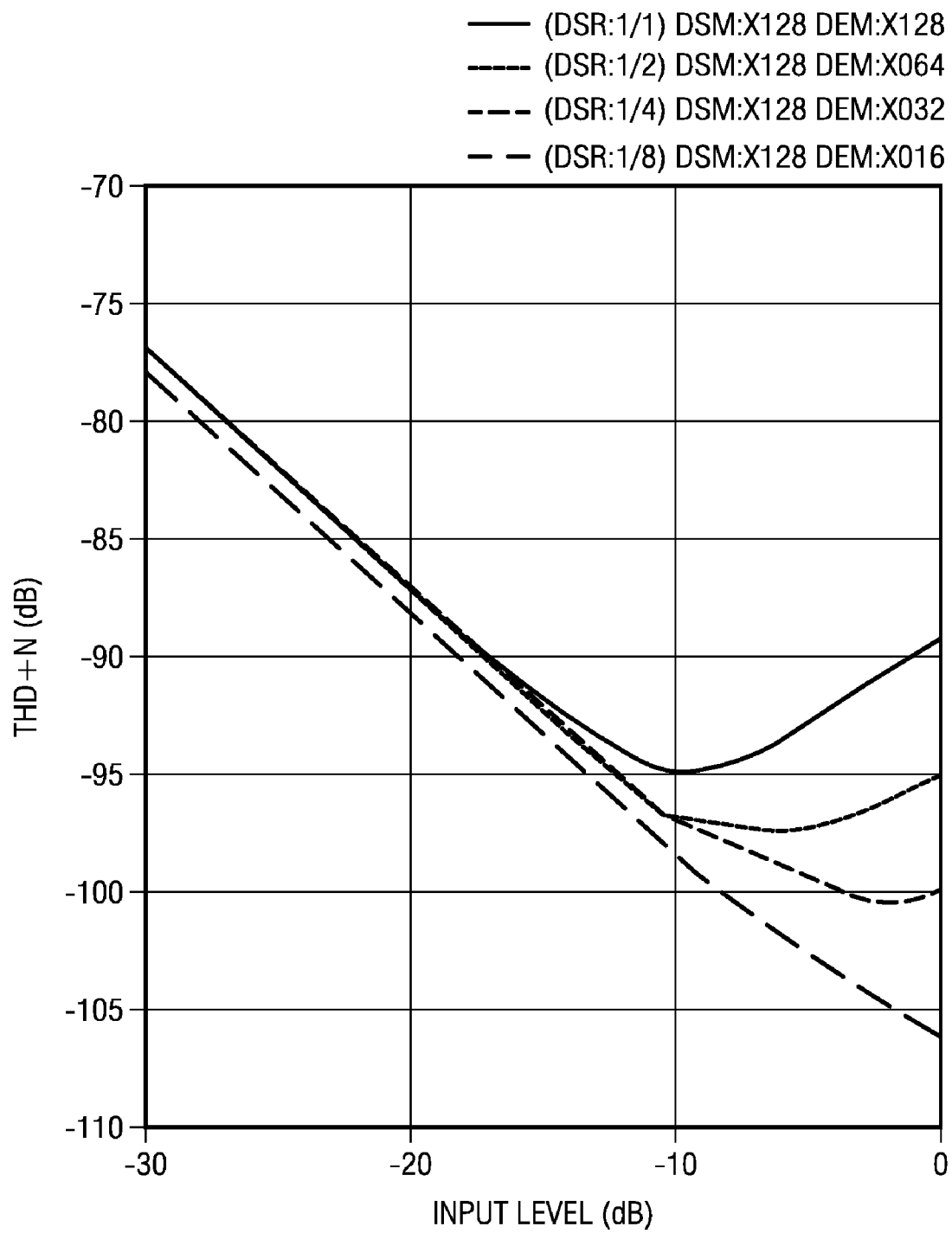
FIG. 10 is a graph illustrating the relationship between the input level and its distortion (THD+N) when four different down-sampling ratios are used for the DAC shown in FIGS. 3 and 4.

In the following, an explanation will be given regarding the effect of improving the performance of distortion (THD=N) by means of the decimation type DEM of the present invention with reference to the results of the simulation shown in FIG. 10. In this simulation, the constitution has a tertiary 17-level ΔΣ modulator and secondary DEM. In this simulation, the over-sampling ratio of the ΔΣ modulator (DSM) is fixed at 128-fold (×128), and the operating frequency of DEM is changed to four values, that is, from 128-fold, the same as that of the over-sampling ratio to 64-fold, 32-fold and 16-fold (corresponding to a down-sampling ratio (DSR) of 1, 2, 4, 8). As shown in the figure, as the down-sampling ratio (DSR) becomes larger, the distortion performance is improved, and, when the down-sampling ratio is 8, it can be seen that the performance can be improved by about 17 dB at the maximum input signal level.

Figure 11:
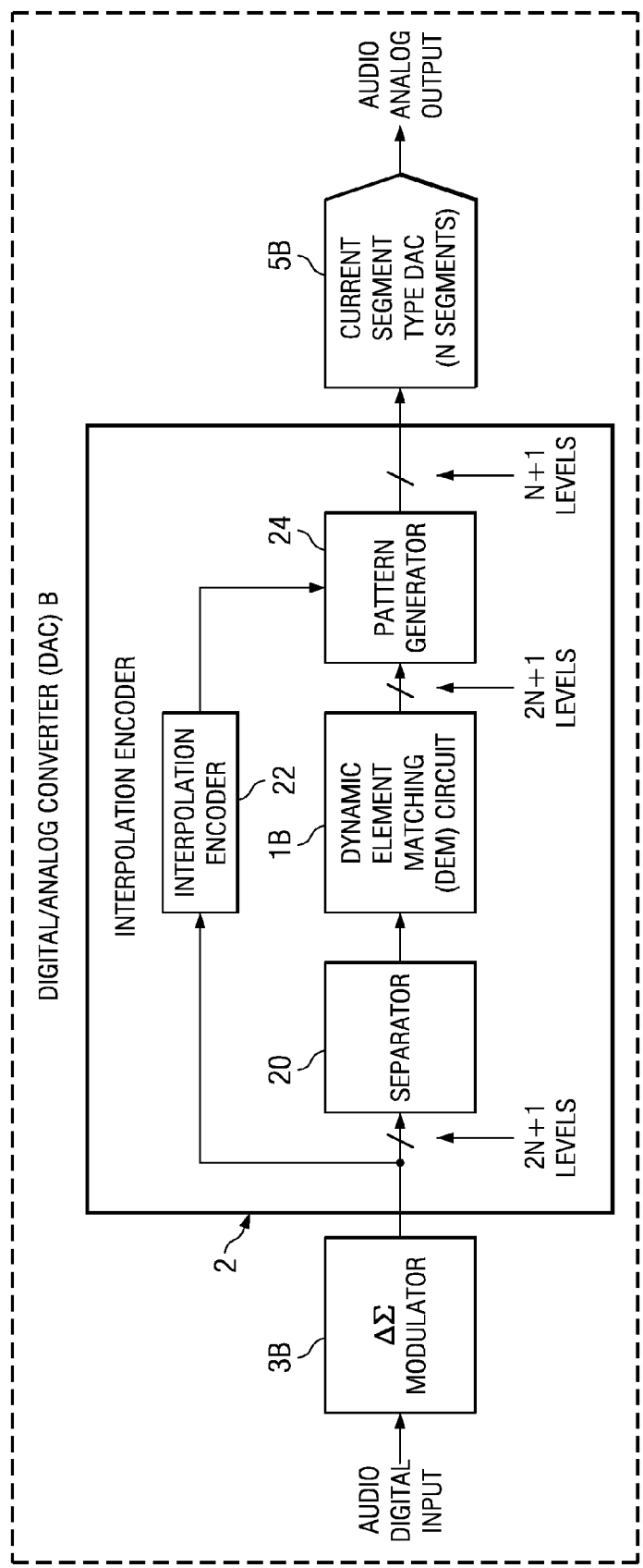
FIG. 11 is a block diagram illustrating the digital/analog converter (DAC) for audio use in another embodiment using the DEM circuit shown in FIG. 1.

In the following, with reference to FIG. 11, an explanation will be given regarding digital/analog converter (DAC) B in another embodiment using DEM circuit 1 shown in FIG. 1. For the DAC B in the present embodiment, the constitution is for executing the "time-domain interpolation encoding" that realizes (2N+1) weight levels by using N current segments. Here, "time-domain interpolation encoding" refers to the function for realizing the generation of interpolated weight levels by means of processing on the time axis. Also, as shown in FIG. 11, "B" is appended to the same part numbers as the corresponding elements shown in FIG. 1 or 3. This DAC B has ΣΔ modulator 3B that receives the audio digital input, interpolation encoder 2 and current segment type DAC 5B. As shown in the figure, here, interpolation encoder 2 has the following parts: separator 20 that receives the output of the modulator, DEM circuit lB that receives the output of the separator, encode determining unit 22 that receives the output of the modulator as input, and pattern generator 24 having an input for receiving the output of DEM circuit lB and an input for receiving the output of encode determining unit 22 and an output connected to DAC 5B. It differs from the constitution shown in FIG. 3 in that as interpolation encoder 2, it also has separator 20, encode determining unit 22 and pattern generator 24 in addition to DEM circuit lB. For the DACB with said constitution, compared with DAC A shown in FIG. 3, the same N current segments are used, and it is possible to increase the level number of the ΣΔ modulation output from N levels to (2N+1) levels.

Figure 12:
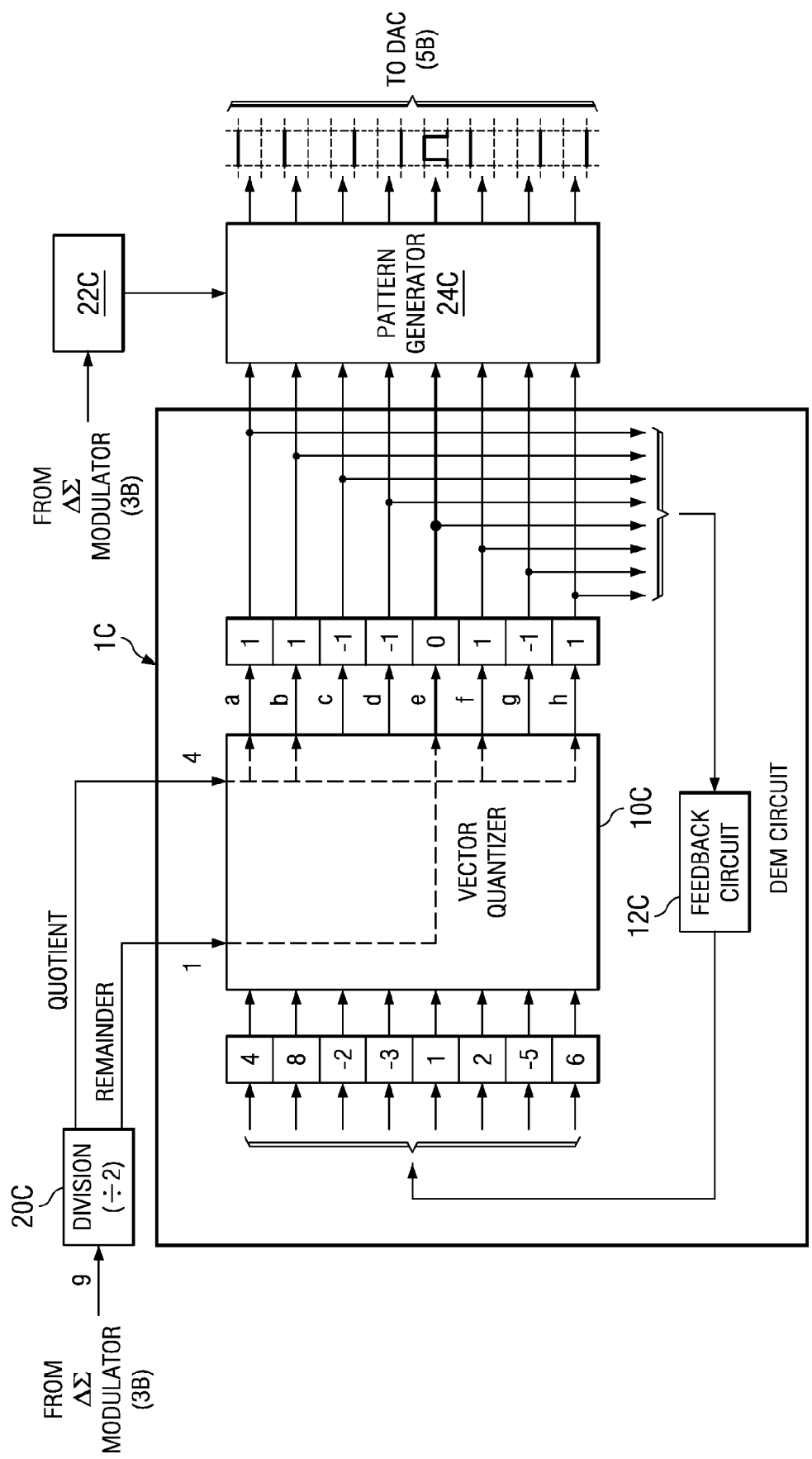
FIG. 12 is a block diagram illustrating the circuit constitution of an embodiment that further specifies some parts of DAC shown in FIG. 11.
Figure 13:
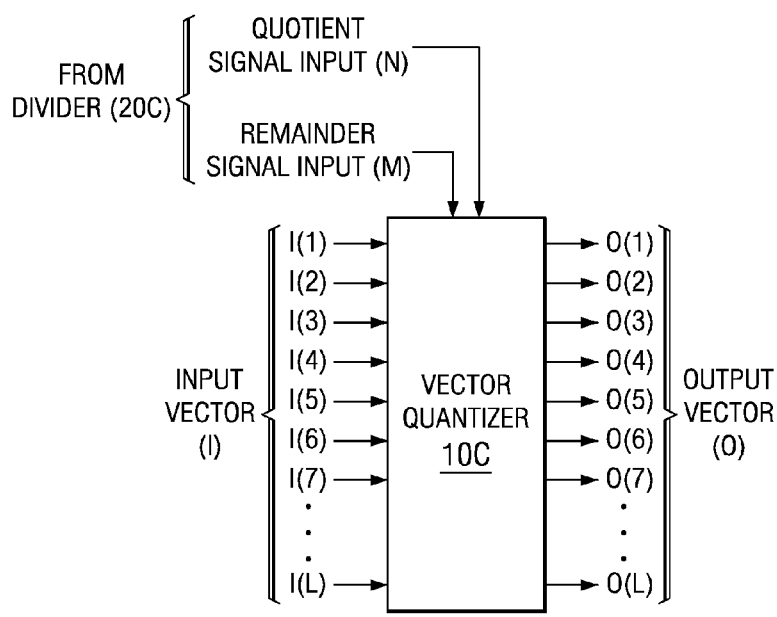
FIG. 13 is a block diagram illustrating in more detail the vector quantizer as a portion of the DEM circuit shown in FIG. 12.
Figures 14, 15:
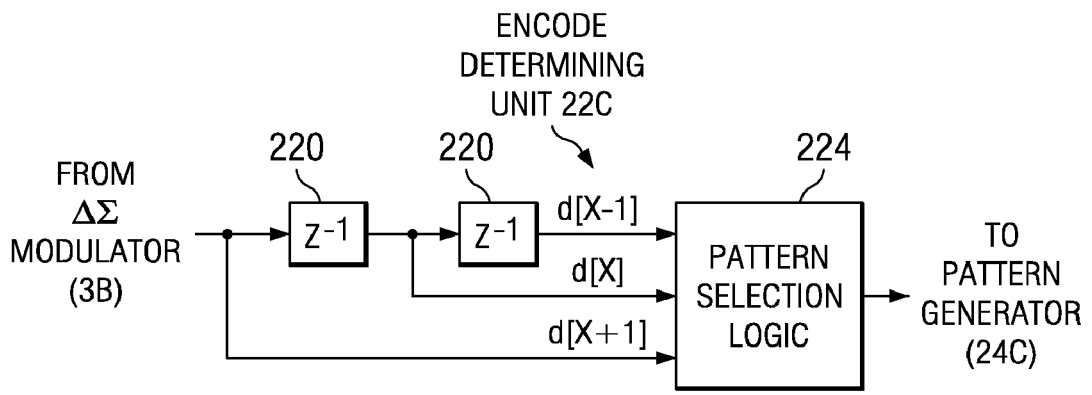
FIG. 14 is a block diagram illustrating the circuit constitution that shows more specifically the encode determining unit shown in FIG. 12.
FIG. 15 is an encode pattern selection table illustrating the selection algorithm in the pattern selection logic shown in FIG. 14.
Figure 16A:
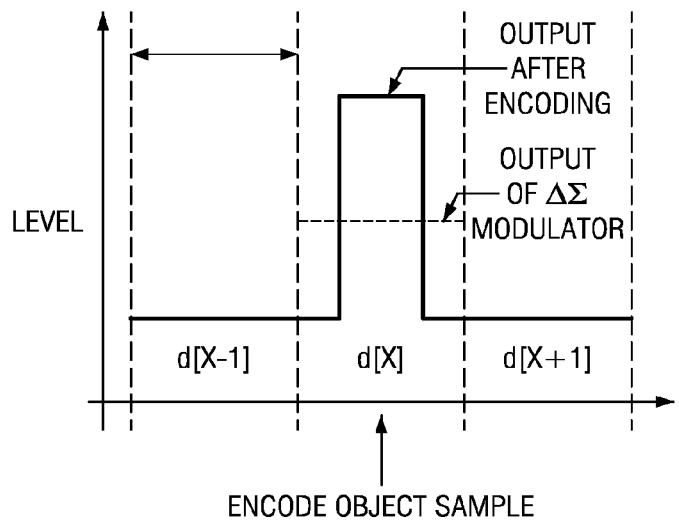
FIGS. 16A, 16B and 16C are diagrams illustrating waveforms for explanation of the pattern selection operation on the basis of the selection algorithm shown in FIG. 15.
Figure 16B:
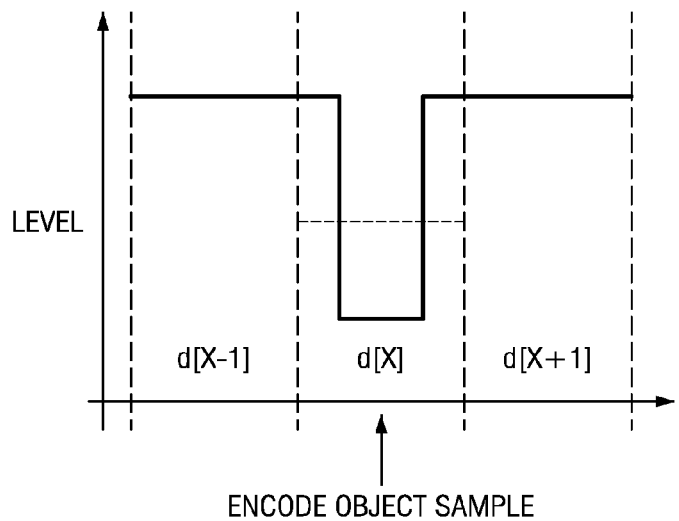
Figure 16C:
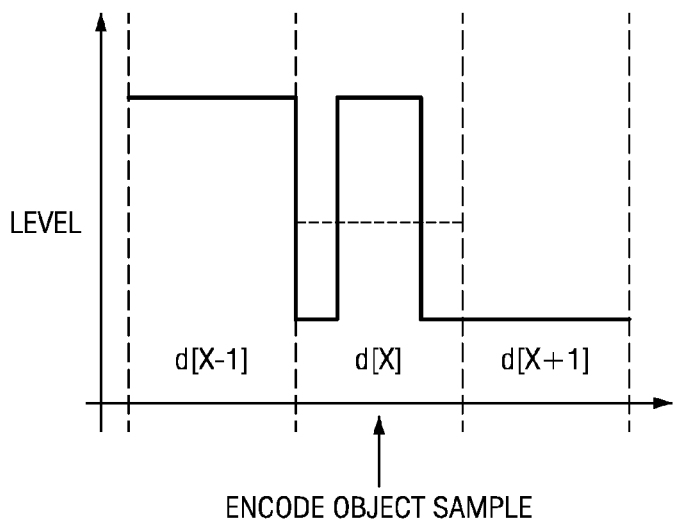
Figure 17:
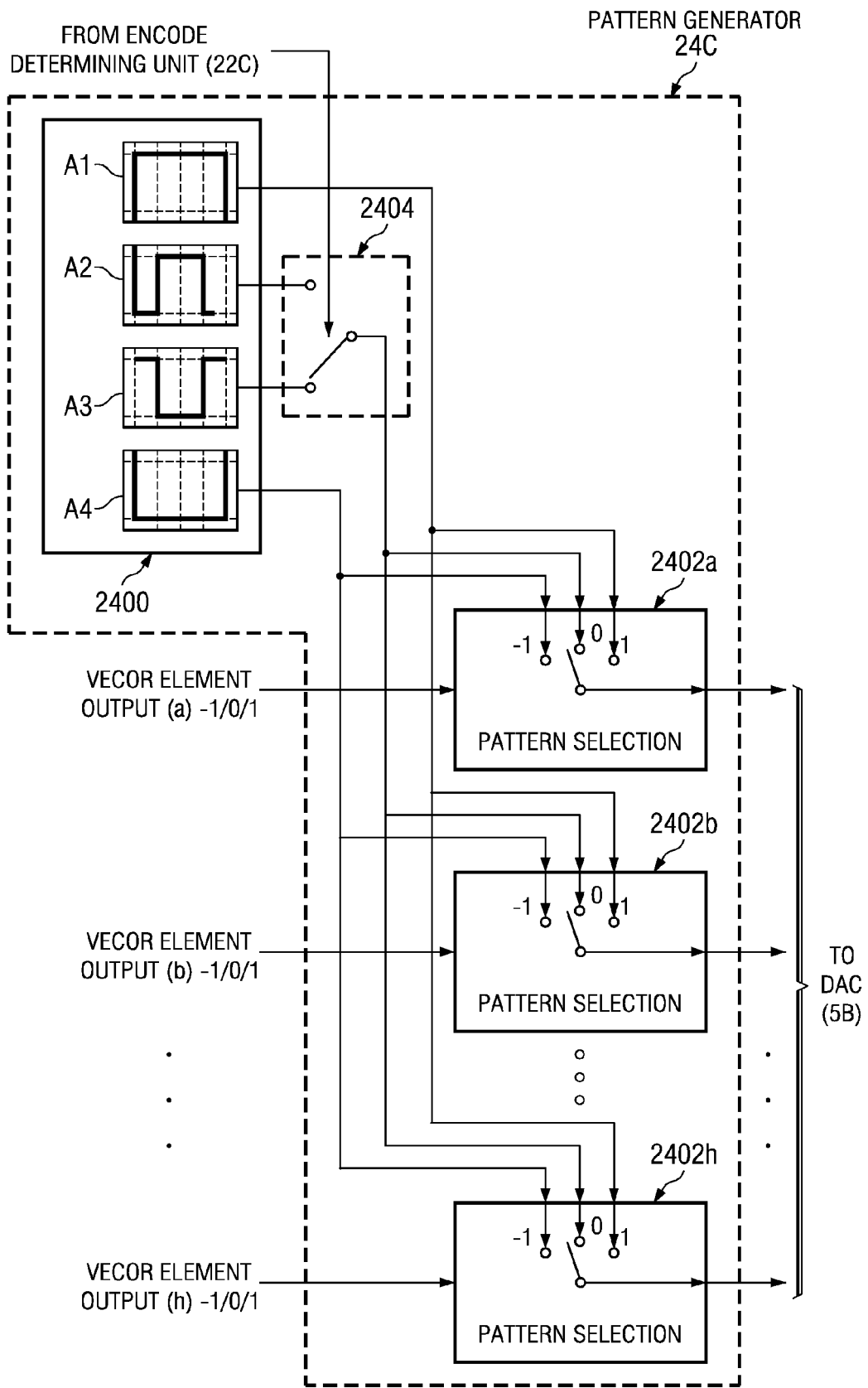
FIG. 17 is a circuit diagram illustrating the circuit constitution of the pattern generator shown in FIG. 11.

In the following, an explanation will be given regarding the circuit constitution of an embodiment in which the various parts of DAC B shown in FIG. 11 are further specified with reference to FIGS. 12-17. FIG. 12 shows in detail only a portion of DAC B, that is, the circuit portion (divider 20C) corresponding to separator 20 in FIG. 11, a portion of the circuit portion (that is, DEM circuit 1C) corresponding to DEM circuit 1B, and the circuit portion corresponding to pattern generator 24 (that is, pattern generator 24C). FIG. 13 shows in detail the circuit of a portion of DEM circuit 1C shown in FIG. 12 (that is, vector quantizer (VQ) 10C). FIG. 14 shows the circuit portion corresponding to encode determining unit 22 (that is, encode determining unit 22C). FIG. 17 shows in detail the circuit of pattern generator 24C.

First of all, as shown in FIG. 12, divider 20C shown in the figure receives the modulation output from modulator 3B, and it divides the received modulation output by 2, and outputs the quotient and remainder. Also, in the example of the specific circuit constitution shown in FIGS. 12-17, the weight levels are nearly halved by means of the constitution of the odd-numbered weight levels as the interpolation weight levels. For this purpose, it is divided by 2 by means of divider 20C. This dividing operation is equal to the separation of the least significant bit and the remaining bit group among the multibit output of the ?S modulator. As a result, it is possible to divide the output of the modulator to the least significant bit and the remaining bit group simply by separating the wiring. In the example shown in FIG. 12, when the output of the modulator has a value of "9," the value of the quotient is "4" while the remainder value is "1." In this way, the generated quotient and remainder are fed to vector quantizer 10C in DEM circuit 1C. As the structure for forming DEM circuit 1C in addition to vector quantizer (VQ) 10C, there is feedback circuit 12C with the output of vector quantizer 10C input to it (corresponding to feedback circuit 12 in FIG. 1). As in the aforementioned example, with said feedback circuit 12C, down-sampling is performed to 1/2, so that the decimation type DEM processing according to the present invention is executed. That is, vector quantizer 10C performs vector quantization, and generates an output vector. Then, the output vector passes through feedback circuit 12C and becomes the input vector to the quantizer for the next quantization cycle. The vector quantizer of the present embodiment differs from that shown in FIG. 4 in that each output of the output vector has 1.5 bits, and, in addition to the two values of "1" and "−1," there is also the value of "0," that is, there are 3 values that can be taken. Here, "0" indicates the bit that performs "time domain interpolation encoding." On the other hand, values "1" and "−1" are conventional bits. Also, "1" indicates use of the current segment, while "−1" indicates non-use.

In the following, an explanation will be given in more detail regarding the operation of vector quantizer 10C with reference to FIG. 13. As shown in the figure, vector quantizer 10C has input vector I composed of L input I[1]-I[L], and output vector O composed of L outputs O[1]-O[L]. Also, for vector quantizer 10C, as input of the other signals other than the input vector, there is only one signal input in vector encoder 10A shown in FIG. 5. In this embodiment, the constitution is such that two signals, that is, quotient signal N and remainder signal M from divider 20C, are received.

Figure 13A:
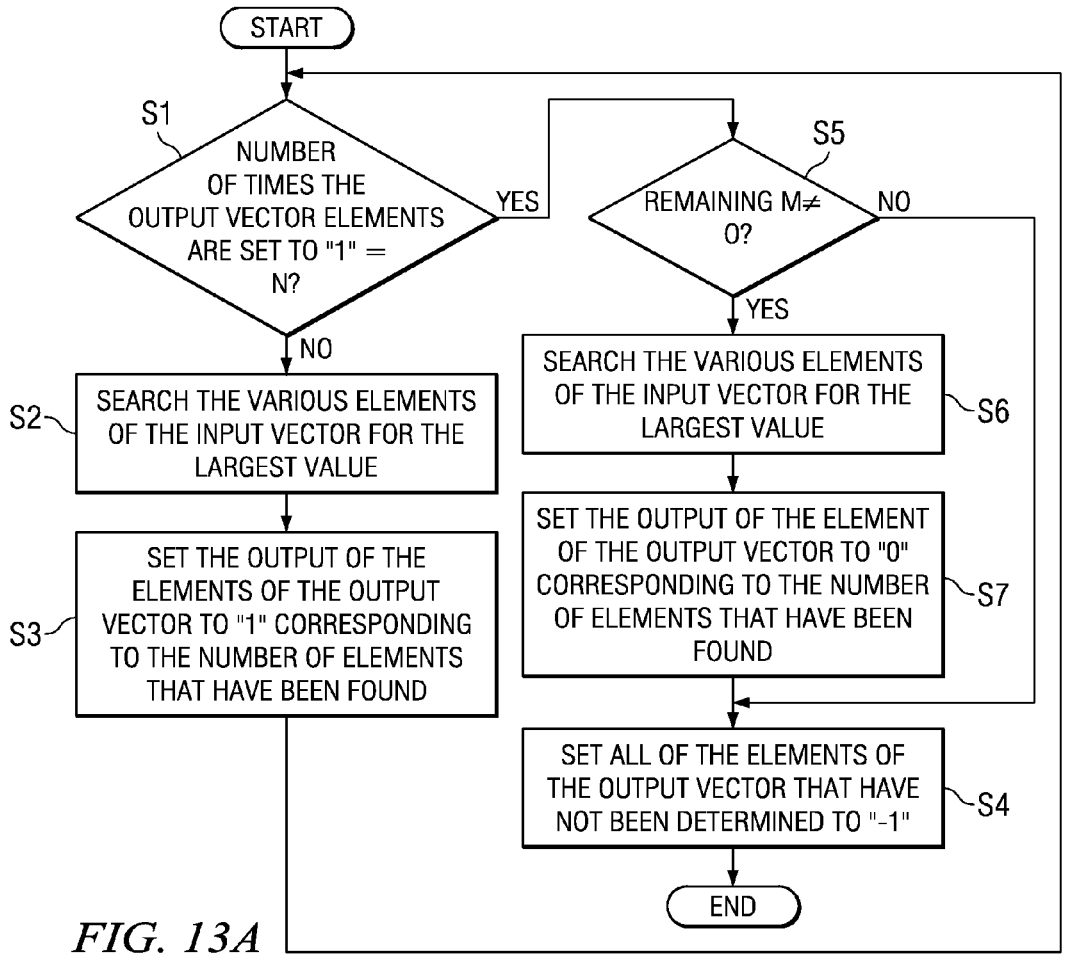
FIG. 13A is a flow chart illustrating the vector quantization algorithm of the vector quantizer shown in FIG. 13.

FIG. 13A shows the vector quantization algorithm of vector quantizer 10C shown in FIG. 13. According to this algorithm, the output vector is determined. Also, the algorithm shown in FIG. 13A differs from the algorithm shown in FIG.

6 in that it has the added steps S5-S7. First of all, in step S1, if the number of cycles for setting the output vector elements to "1" that has been performed is equal to quotient N as the input signal, process control goes to step S4. If not, it goes to step S2. When it is not equal to quotient N, in step S2, the element having the largest value is searched for from the various element values of the input vector. Here, the search is conducted from among those elements for which the corresponding output elements O[x] have not been determined, and the element number that is found is taken as X. That is, one has I[X]≧I[j]. Here,0≦j≦L, or when j≠X,X is not in use. Then, process control goes to step S3. Here, the outputs of the elements of the output vector corresponding to the element number found in step S2 are set to "1." That is, O[X]=1. Then, process control returns to step S1. On the other hand, when it is YES in step S1, that is, when a "1" is set only for the number equal to the quotient, process control goes to step S5. Here, it is determined whether remainder M is zero. If it is not zero, process control goes to step S6, and, if it is zero, it goes to step S4. If it is not zero, in step S6, the element having the largest value is searched for among the various element values of the input vector. Here, a search is conducted among those elements for which the corresponding output elements O[x] have not been determined, and the found element number is taken as X. That is, one has I[X]≧I[j]]. Here, 0≦j≦L, or, when j≠X, X is not in use. On the other hand, in step S5, when remainder M is zero or after execution of step S7, process control goes to step S4. Here, all of the elements of the output vector that have not been determined are set to "−1." As a result, this algorithm comes to an end. Also, like the embodiment shown in FIG. 4, the input vector is obtained by multiplying to the output of the loop filter (corresponding to loop filter (122A) shown in FIG. 4) contained in the feedback circuit by −1. This is obtained by inverting the value obtained by integrating (including high-order integration) each element of the output vector. As a result, in the output vector, the input vector element corresponding to the element without setting to "1" becomes a larger value, so that it is a simple matter to select the element for outputting "1" during the next cycle. Due to this operation, the number of cycles of use of the current segments in DAC 5B is averaged, so that DEM processing is realized. This feature is the same as described above. In this way, even if two signals N and M are input to the vector quantizer, it is still possible to perform the decimation type DEM processing according to the present invention.

In the following, an explanation will be given regarding the operation of vector quantizer 10C explained above with reference to the numeric example shown in FIG. 12. Here, the number of elements of the vector is L=8. In the numeric example shown in the figure, elements I[1]-I[8] of the input vector as the parallel outputs from feedback circuit 12C have the values of 4, 8, −2, −3, 1, 2, −5, 6 (these values are shown in the boxes), and the quotient from the divider is 4, with a remainder of 1. In this case, the vector quantizer sequentially selects the number corresponding to the quotient value "4" from the larger value for the input vector elements. Then, the output elements O[2], O[8], O[0], O[1], O[6] (corresponding to outputs b, h, f, a) are sequentially set to "1" (the values of the output vector elements are shown in the box). This process is carried out by repeating steps of operation S1-S3 four times. Then, after the number of times "1" is set becomes equal to quotient 4, since the remainder is 1, input vector element I[5] having the next largest value is selected, and value "0" is set at output vector element O[5] corresponding to the selected input vector element (corresponding to output e). This is performed by executing steps of operation S5-S7. Then, "−1" is set in the output vector elements O[3], O[4], O[7] corresponding to the remaining input vector elements I[3], I[4], I[7]. This is realized by executing step S4. In this way, the value of the output vector is determined.

In the following, an explanation will be given in more detail regarding the circuit constitution of encode determining unit 22C with reference to FIG. 14. As shown in the figure, encode determining unit 22C has two delay units 220 and 222 connected in series, and pattern selecting logic 224. Said pattern selecting logic 224 has input (d[x+1]) that directly receives the output of ?S modulator 3B, input (d[x]) that receives the output of the modulator via delay unit 220, and input (d[x−1]) that receives the output of delay unit 220 via delay unit 222. As a result, pattern selecting logic 224 receives the current sample d[x] in the output of the modulator and the two immediately adjacent samples, that is, preceding sample d[x−1] and succeeding sample d[x+1], and generates the determining signal on the basis of said immediately adjacent samples. The determined signal is sent to pattern generator 24C, and in pattern generator 24C, the pattern that should be selected is assigned.

FIG. 15 is an encode pattern selection table illustrating the selection algorithm in pattern selecting logic 224. FIGS. 16A-16C are diagrams illustrating the example of waveform for illustrating the pattern selection operation on the basis of the selection algorithm. In the pattern selection table shown in FIG. 15, in case 1, that is, in the case when both the preceding sample and the succeeding sample are lower than the current sample, as shown in FIG. 16A, the pattern that "projects upward" should be selected. In FIG. 16A, for the sample as object of the interpolation encoding, the broken line shows the output of ΔΣ modulator before the interpolation encoding, and the solid line shows the output after the interpolation encoding as a result of selection of the "upward convex" pattern. In case 2 in the pattern selection table, both the preceding sample and the succeeding sample are higher than the current sample. In this case, as shown in FIG. 16B, the pattern that "projects downward" pattern should be selected. In FIG. 16B, for the sample as object the interpolation encoding, like that shown in FIG. 16A, the broken line shows the output of ΔΣ modulator before the interpolation encoding, and the solid line shows the output after the interpolation encoding as a result of selection of the pattern that "projects upward." In case 3 of the selection table, that is, when it is neither case 1 nor case 2 (when either the preceding sample or the succeeding sample is larger than the current sample, while the other is smaller than the current sample), when the current sample has a non-zero positive value, as shown in FIG. 16C, the pattern that "projects upward" should be selected. In FIG. 16C, for the sample as object of the interpolation encoding, as in the case shown in FIG. 16A, the broken line shows the output of ΔΣ modulator before the interpolation encoding, and the solid line shows the output after the interpolation encoding as a result of selection of the pattern that "projects downward" pattern. On the other hand, in case 4 in the pattern selection table, it differs from case 3 in that as the current sample is negative, the pattern that "projects downward" should be selected. The determining signal generated by pattern selecting logic 224 becomes low when the pattern that "projects downward" is shown, and it becomes high when the pattern that "projects upward" is shown.

In the following, an explanation will be given in more detail regarding the circuit constitution of pattern generator 24C with reference to FIG. 17. As shown in the figure, pattern generator 24C has pattern memory 2400, eight pattern selectors 2402a-3402h(8 is the same as the number of output vector elements of vector quantizer 10C in the embodiment shown in FIG. 12), and a switch 2404. More specifically, as shown in the figure, pattern memory 2400 has two memory regions A2 and A3 for storing the two waveform data of the pattern that "projects upward" and pattern that "projects downward" used in time-domain interpolation encoding. In addition, in the present circuit constitution, there are two memory regions Al and A4 for storing the waveform data of two patterns, a high pattern (corresponding to "1") and a low pattern (corresponding to "−1"), for the entirety. Said switch 2404 has two input terminals, one control input terminal, and one output terminal. The two inputs are connected to the outputs of memory regions A2 and A3, and the control input terminal is connected to receive the determining signal from encode determining unit 22C. When the determining signal is high, the output of memory region A2 indicating the pattern that "projects upward" is selected, and, when the determining signal is low, the output of memory region A3 indicating the pattern that "projects downward" pattern is selected. On the other hand, said pattern selectors 2402a-2402h have the same constitution, and each have three input terminals (indicated by symbols "−1," "0," "+1"), one control input terminal, and one output terminal. Of the three input terminals of the selector, input terminal "−1" is directly connected to the output of memory region A4. Input terminal "1" is directly connected to the output of memory region Al, and input terminal "0" is connected to the output terminal of switch 2404. Also, the control input terminals of the selector are connected to the corresponding element outputs a-h of the output vector of vector quantizer 10C. When the control input is "−1," the input of input terminal "−1" is selected; when the control input is "0," the input of input terminal "0" is selected; and, when the control input is "1," the input of input terminal "1" is selected and sent to the output terminal. The output terminal of the selector is connected to the input of DAC 5B.

In the following, an explanation will be given regarding the operation of pattern generator 24C with said constitution with reference to the numeric example shown in FIG. 12 and also with reference to said FIGS. 16A-16C. First of all, for vector element outputs a, b, f, h of vector quantizer 10C, since all of these outputs have a value of 1 in the example shown in this figure, pattern selectors 2402a, b, f, h select and output the input of input terminal "1," that is, they select and output the pattern of the complete high pattern from memory region A1. On the other hand, in the case of vector element outputs c, d, g, since the various element outputs are of value −1, pattern selectors 2402c, d, g select and output the input of input terminal "−1," that is, they select and output the complete low pattern from memory region A4. On the other hand, for vector element output (e), as this element output has value of 0, pattern selector 2402e selects and output the input of input terminal "0," that is, it selects and outputs the pattern for interpolation encoding from memory region A2 or memory region A3 depending on the determining signal from encode determining unit 22C. As a result, as shown in FIGS. 16 A-16C interpolation encoding is performed. In pattern generator 24C explained above, not only the pattern for interpolation encoding but also the normal patterns can be stored in pattern memory 2400. This method is adopted in order to facilitate timing control in the pattern generating operation. Consequently, it is also possible to store only the pattern for interpolation encoding in the pattern memory and use the output of vector quantizer 10C directly as the normal pattern.

For the DAC B for executing the time domain interpolation encoding explained above, by using the DEM circuit of the present invention, it is possible to reduce the number of switching times of the current segment. Also, in the aforementioned embodiment, the explanation pertained to audio signals. However, the present invention may also be adopted for video signals and communication signals as examples of signals in frequency bands different from that of audio signals. In addition, in said embodiment, the explanation pertained to a DAC using the DEM circuit of the present invention. However, the present invention may also be adopted to other electronic devices, such as analog/digital converter (ADC), digital signal processor (DSP), and other electronic devices.

Those skilled in the art to which the invention relates will appreciate that various changes may be made to the described example embodiments and many other embodiments implemented, within the scope of the claimed invention.

The invention claimed is:

1. A dynamic element matching method characterized by the fact that a digital output is generated for a digital input with a first time rate by means of dynamic element matching processing with a second time rate unlike the first time rate of said digital input,wherein said second time rate is lower than said first time rate.

2. The dynamic element matching method described in claim 1 wherein said digital input is for using plural weight generators.

3. The dynamic element matching device wherein it generates a digital output for a digital input by performing dynamic element matching processing at a second time rate unlike the first time rate of the digital input, wherein said DEM device has an encoder with the following features: it is an encoder that has a first input connected to receive said digital input and a second input having parallel inputs in a number corresponding to the number of said plural weight generators; corresponding to said first input and said second input, it generates an encoder output for selecting said weight generators in a number corresponding to the magnitude of said digital input by means of a combination based on said second input, and said encoder output has parallel outputs in a number corresponding to the number of said plural weight generators;

wherein it has a feedback circuit with the following features: it is a feedback circuit connected between said output and said second input of said encoder; it has parallel paths in a number corresponding to the number of said plural weight generators; and said parallel paths are connected between the parallel outputs of said encoder output and the parallel inputs of said second input; and, wherein each of said parallel paths of said feedback circuit comprises: a sampling rate converter that receives the correlated output among the parallel outputs of said encoder; and a loop filter that receives the output of said sampling rate converter and its output is connected to the correlated input among the parallel inputs of said second input of said encoder.

4. The dynamic element matching device described in claim 3 wherein said digital input is for use with plural weight generators.

5. The dynamic element matching device described in claim 3 wherein said digital input comprises a first portion and a second portion corresponding to the quotient and remainder of the result of division of said digital input by a certain number; and wherein said first input comprises an input that receives said first portion, and an input that receives said second portion.

6. The dynamic element matching device described in claim 3 wherein said digital input is the output of a delta sigma modulator.

7. The dynamic element matching device described in claim 3 wherein said encoder is a vector quantizer.

8. The dynamic element matching device described in claim 3 wherein each of said parallel outputs of said encoder has a first value when the correlated weight generator is in use, and a second value when the correlated weight generator is not in use.

9. The dynamic element matching device described in claim 8 wherein each of said parallel outputs of said encoder has a value intermediate between said first value and said second value when the correlated weight generator is partially in use.

10. The dynamic element matching device described in claim 3 wherein said sampling rate converter is a 1/M down-converter that converts the sampling rate of said digital input.

11. The dynamic element matching device described in claim 3 wherein said loop filter generates a value correlated to the number of cycles recently selected by the correlated weight generator.

12. An electronic device equipped with the dynamic element matching device described in claim 3.

13. The electronic device described in claim 12 wherein said electronic device is DAC, ADC, or DSP.

* * * * *